US007126507B2

(12) United States Patent
Lee

(10) Patent No.: US 7,126,507 B2
(45) Date of Patent: Oct. 24, 2006

(54) ANALOG-DIGITAL CONVERTER USING CLOCK BOOSTING

(75) Inventor: Woo-Yol Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/113,127

(22) Filed: Apr. 25, 2005

(65) Prior Publication Data

US 2005/0258996 A1 Nov. 24, 2005

(30) Foreign Application Priority Data

Apr. 26, 2004 (KR) .................... 10-2004-0028735

(51) Int. Cl.
*H03M 1/06* (2006.01)
(52) U.S. Cl. ...................... 341/118; 341/155
(58) Field of Classification Search ............. 341/161, 341/118, 120, 155, 122
See application file for complete search history.

(56) References Cited

U.S. PATENT DOCUMENTS 5,635,937 A * 6/1997 Lim et al. ............... 341/161

6,480,128 B1 * 11/2002 Bach et al. ............... 341/122
2004/0061637 A1 * 4/2004 Fujimoto

* cited by examiner

*Primary Examiner*—Jean Bruner Jeanglaude
(74) *Attorney, Agent, or Firm*—Birch, Stewart, Kolasch & Birch, LLP

(57) ABSTRACT

Disclosed herein is an analog-digital converter. The analog-digital converter includes a sample-and-hold amplifier, a first analog-digital converter, a multiple digital-analog converter, a second analog-digital converter, and a digital correction logic. The sample-and-hold amplifier samples an analog input signal using clock boosting. The first analog-digital converter receives a sampled signal, and converts the sampled signal into a plurality of bits of first digital output code. The multiple digital-analog converter receives and stores the sampled signal, and amplifies and outputs the difference between the stored signal and an analog signal corresponding to the first digital output code. The second analog-digital converter receives the output signal of the multiple digital-analog converter, and converts the output signal into a plurality of bits of second digital output code. The digital correction logic receives the first digital output code and the second digital output code, overlaps certain bits of the first digital output code with certain bits of the second digital output code, and outputs remaining bits, exclusive of overlapping bits, as final digital output code.

12 Claims, 3 Drawing Sheets

ANALOG-DIGITAL CONVERTER USING CLOCK BOOSTING

BACKGROUND OF THE INVENTION

1. Field of the Invention

The present invention relates generally to an analog-digital converter and, more particularly, to a sample-and-hold amplifier using a clock boosting technique and an analog-digital converter having the sample-and-hold amplifier.

2. Description of the Related Art

Recently, with the development of high density Very Large-Scale Integration (VLSI) processing technology and Digital Signal Processing (DSP) technology, the demand for high performance analog-digital converters to be used in high quality video systems, next generation personal portable communication equipment, high speed digital communication networks and medical equipment is gradually increasing. Furthermore, as the demand for portable equipment is increasing, low power, low voltage analog-digital converters, each of which, together with another Complimentary Metal-Oxide Semiconductor (CMOS) that uses a 1.8 V level low voltage source, can be implemented in a single chip, is under great demand. In particular, in the case of image display applications, such as a flat display input unit and a Liquid Crystal Display (LCD) monitor drive circuit, a sampling rate is equal to or higher than 100 MHz and several-hundred-MHz-level input signals must be processed at a resolution of 8 bits, so that analog-digital converters, to the input terminals of which sample-and-hold amplifiers capable of operating at high speed and sampling high frequency input signals are applied, are essential.

Recently, the market for digital televisions has rapidly expanded. Additionally, Vestigial Side Band (VSB) will be used as the standard for a digital television reception method in Korea. When VSB digital television is received, analog-digital converters are used to digitally process analog television signals.

A conventional method of sampling an analog signal to produce an input for an analog-digital converter is performed using a tuner, a Surface Acoustic Wave (SAW) filter and a mixer, as shown in FIG. 1. Accordingly, this method is disadvantageous in that the unit cost of a digital television board is high because the method should employ a two-stage mixer.

Additionally, the circuit of the method is disadvantageous in that, when a very high input frequency enters in the case where the circuit is used in a sub-sampling analog-digital converter, the operational characteristics of sampling results are deteriorated due to the increase and variation of input impedance, thus causing reduction in performance. Accordingly, it is difficult to obtain a signal of more than 8 bits. As a result, it is difficult to use the circuit of the method in a sub-sampling analog-digital converter.

SUMMARY OF THE INVENTION

Accordingly, the present invention has been made keeping in mind the above problems occurring in the prior art, and an object of the present invention is to provide an analog-digital converter that makes it unnecessary to use a mixer by improving the characteristics of the sample-and-hold amplifier of a sub-sampling analog-digital converter.

In order to accomplish the above object, the present invention provides an analog-digital converter, including a sample-and-hold amplifier for sampling an analog input signal using clock boosting; a first analog-digital converter for receiving a signal sampled by the sample-and-hold amplifier, and converting the sampled signal into a plurality of bits of first digital output code; a multiple digital-analog converter for receiving and storing the signal sampled by the sample-and-hold amplifier, and amplifying and outputting the difference between the stored signal and an analog signal corresponding to the first digital output code; a second analog-digital converter for receiving the output signal of the multiple digital-analog converter, and converting the output signal into a plurality of bits of second digital output code; and a digital correction logic for receiving the first digital output code and the second digital output code, overlapping certain bits of the first digital output code with certain bits of the second digital output code, and outputting remaining bits, exclusive of overlapping bits, as final digital output code.

Preferably, the sample-and-hold amplifier comprises a clock boosting circuit that is connected to an input terminal, to which the analog input signal is input, and a gate of a switch transistor, which is connected to the input terminal, so as to maintain ON resistance of the switch transistor at a small and constant value and fix input impedance.

Preferably, the sample-and-hold amplifier includes a first N-channel Metal-Oxide Semiconductor (NMOS) switch transistor connected to a positive input terminal; a second NMOS switch transistor connected to a negative input terminal; a first clock boosting circuit connected to the positive input terminal and a gate of the first NMOS switch transistor so as to maintain ON resistance of the first NMOS switch transistor at a small and constant value regardless of voltage variation of a signal input through the positive input terminal; and a second clock boosting circuit connected to the negative input terminal and a gate of the second NMOS switch transistor so as to maintain ON resistance of the second NMOS switch transistor at a small and constant value regardless of voltage variation of a signal input through the negative input terminal.

Preferably, the sample-and-hold amplifier includes a first P-channel Metal-Oxide Semiconductor (PMOS) switch transistor connected in parallel with the first NMOS switch transistor between the positive input terminal and a first node and configured to respond to a sampling clock; a second PMOS switch transistor connected in parallel with the second NMOS switch transistor between the negative input terminal and a second node and configured to respond to the sampling clock; a first capacitor a first end of which is connected to the first node; a second capacitor a first end of which is connected to the second node; an amplifier configured to differentially amplify a signal transmitted through the first capacitor and a signal transmitted through the second capacitor and output the differentially amplified signals to the positive output terminal and the negative output terminal; a first transmission gate connected between the first node and the positive output terminal and configured to respond to a holding clock; a second transmission gate connected between the second node and the negative output terminal and configured to respond to the holding clock; and an NMOS transistor connected between the positive output terminal and the negative output terminal and configured to respond to the holding clock.

Preferably, the first and second gate clock boosting circuits each include a first capacitor a first end of which is connected to an inversion signal of the sampling clock; a second capacitor a first end of which is connected to the sampling clock through a reverse inverter; a first NMOS transistor to a drain of which a power source voltage is applied, to a source of which a second end of the first capacitor is connected, and to a gate of which a second end of the second capacitor is connected; a second NMOS transistor to a drain of which the power source voltage is applied, to a source of which a second end of the second capacitor is connected, and to a gate of which a source of the second NMOS transistor is connected; a third NMOS transistor to a drain of which the power source voltage is applied and to a gate of which a gate of the second NMOS transistor is connected; a third capacitor to a first end of which a source of the third NMOS transistor is connected; a fourth NMOS transistor to a drain of which a second end of the third capacitor is connected, to a gate of which an inversion signal of the sampling clock is applied, to a source of which a ground voltage is applied; a first PMOS transistor to a source of which the power source voltage is applied, and to a gate of which the sampling clock is applied; a fifth NMOS transistor to a drain of which a drain of the first PMOS transistor is connected, to a gate of which the sampling clock is connected, and to a source of which a second end of the third capacitor is connected; a sixth NMOS transistor to a drain of which a drain of the first PMOS transistor is connected, and to a source of which a second end of the third capacitor is connected; a second PMOS transistor to a source of which a source of the third NMOS transistor is connected, to a gate of which a drain of the sixth NMOS transistor is connected, to a drain of which an output terminal of the clock boosting circuit is connected, and the gate and the source of which are connected to each other; a seventh NMOS transistor to a source of which a second end of the third capacitor is connected, to a gate of which an output terminal of the clock boosting circuit is connected, and to a drain of which an input terminal of the clock boosting circuit is connected; an eighth NMOS transistor to a drain of which an output terminal of the gate bootstrapping circuit is connected, and to a gate of which the power source voltage is applied; and a ninth NMOS transistor to a drain of which a source of the eighth NMOS transistor is connected, to a gate of which the inversion signal of the sampling clock is applied, and to a source of which the ground voltage is applied.

Preferably, the multiple digital-analog converter uses a combined capacitor switching technique.

Preferably, the second analog-digital converter and the multiple digital-analog converter are one or more first analog-digital converters, one or more second analog-digital converters and one or more multiple digital-analog converters, respectively.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
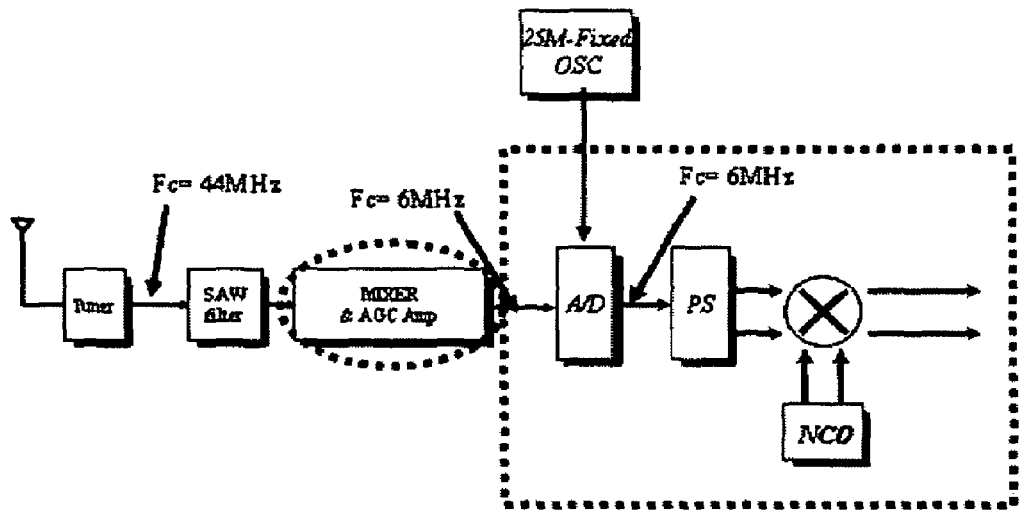
FIG. 1 is a block diagram of a digital television receiving end using an analog-digital converter that includes a general sample-and-hold amplifier.

Reference now should be made to the drawings, in which the same reference numerals are used throughout the different drawings to designate the same or similar components.

Figure 2:
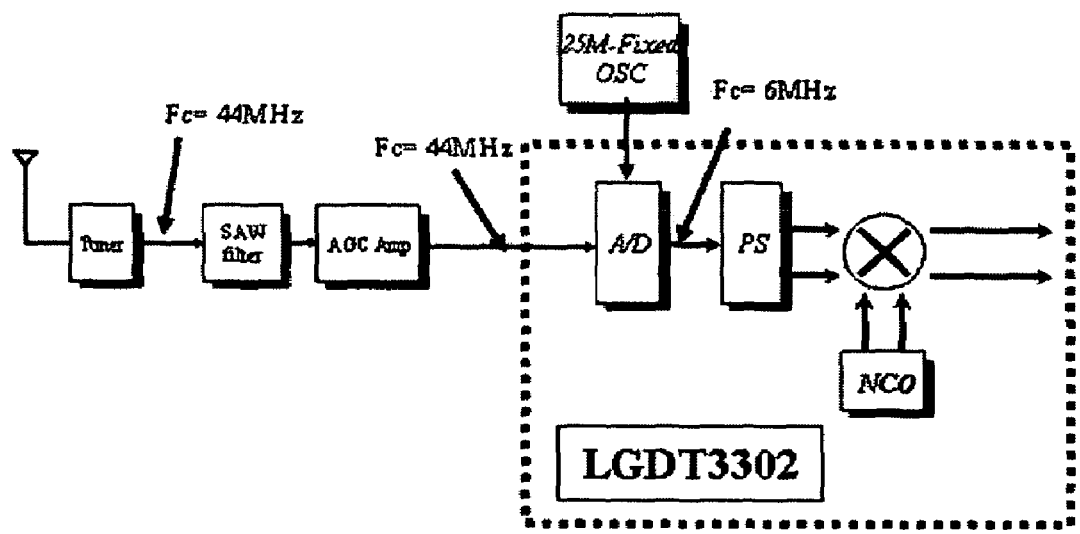
FIG. 2 is a block diagram of a digital television receiving end that is desired to be implemented by the present invention.

FIG. 2 illustrates a method of sampling an analog signal to produce an input for an analog-digital converter in which the mixer in FIG. 1 is not employed.

Figure 3:
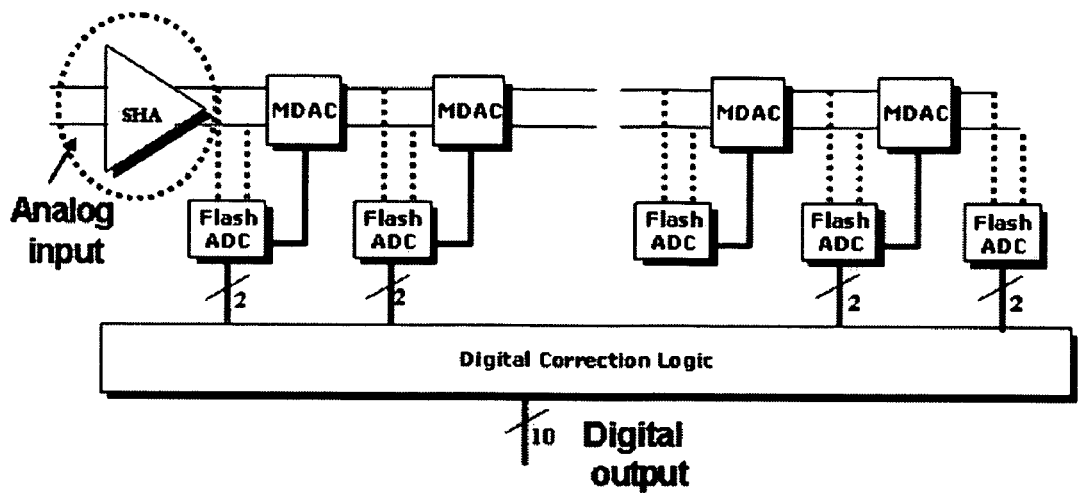
FIG. 3 is an overall block diagram of an analog-digital converter according to an embodiment of the present invention.

FIG. 3 is an overall block diagram of an analog-digital converter according to an embodiment of the present invention.

Referring to FIG. 3, the analog-digital converter according to the present invention has a pipeline structure that acquires two bits from each of a plurality of stages, and includes a sample-and-hold amplifier (SHA) 101, a multiple digital-analog converter 103, a plurality of flash analog-digital converters 102 and a Digital Correction Logic (DCL) 104.

The analog-digital converter of the present invention employs two clocks, which do not overlap each other, to convert an analog input signal into digital output code.

The sample-and-hold amplifier (SHA) 101 employs a clock boosting technique, samples an analog input signal in response to a sampling clock and transmits sampled signals to the capacitor string of the multiple digital-analog converter 103. The first flash analog-digital converter receives a signal sampled by the sample-and-hold amplifier 101, and converts the sampled signal into two bits of first digital output code. The portion of an overall reference voltage to which the input signal corresponds is determined by the two bits of first digital output code. The first digital output code is transferred to the digital correction logic 104 so that the first digital output code can be processed in conjunction with second digital output code output from the second analog-digital converter 102. The multiple digital-analog converter 103 receives the signal sampled by the sample-and-hold amplifier, and stores the signal in the capacitor string. The multiple digital-analog converter 103 amplifies a residual voltage, which is the difference between the analog signal stored in the capacitor string and the analog signal corresponding to the first digital output code, eight times at a cycle next to a sampling clock and outputs an amplified voltage to the second analog-digital converter 102. The second analog-digital converter 102 receives the output signal of the multiple digital-analog converter 103 and converts the output signal into a plurality bits of second digital output code.

The digital correction logic 104 receives the two bits of first digital output code and the two bits of second digital output, overlaps certain bits of the first digital output code with certain bits of the second digital output code, and outputs the remaining ten bits, exclusive of the overlapping bits, as final digital output code. The digital correction logic 104 obtains the final ten bits, exclusive of overlapping bits, by overlapping the output codes of the individual flash analog-digital converters to correct error values, such as feedthrough and offset, that are generated between the flash analog-digital converter 102, the sample-and-hold amplifier 101 and the multiple digital-analog converter 103.

The multiple digital-analog converter 103 uses a combined capacitor switching technique so as to implement an analog-digital converter that has minimal power consumption and a minimal area and operates at a very fast speed. Using the combined capacitor switching technology, unit capacitors of the multiple digital-analog converter 103 are combined into pairs, so that the number of capacitors required can be reduced by 50%. As a result, the area of the multiple digital-analog converter 103 is considerably reduced and the size of the load of the multiple digital-analog converter 103 is reduced to half, so that the multiple digital-analog converter 103 can operate at 200 MHz. Additionally, an existing interpolation technique is applied to the individual analog-digital converters 102, so that the load of the multiple digital-analog converter can be further reduced.

The performance of the sample-and-hold amplifier 101 that samples an analog input signal is of significant importance in obtaining the high rate, high resolution performance and input bandwidth considerably higher than a sampling rate that are required by the analog-digital converter. Accordingly, in the present invention, the sample-and-hold amplifier 101 uses a clock boosting technique, and the construction and operation of the sample-and-hold amplifier are described in detail with reference to FIG. 4.

The above-described process is repeated in the flash analog-digital converters and the multiple digital-analog converter.

Figure 4:
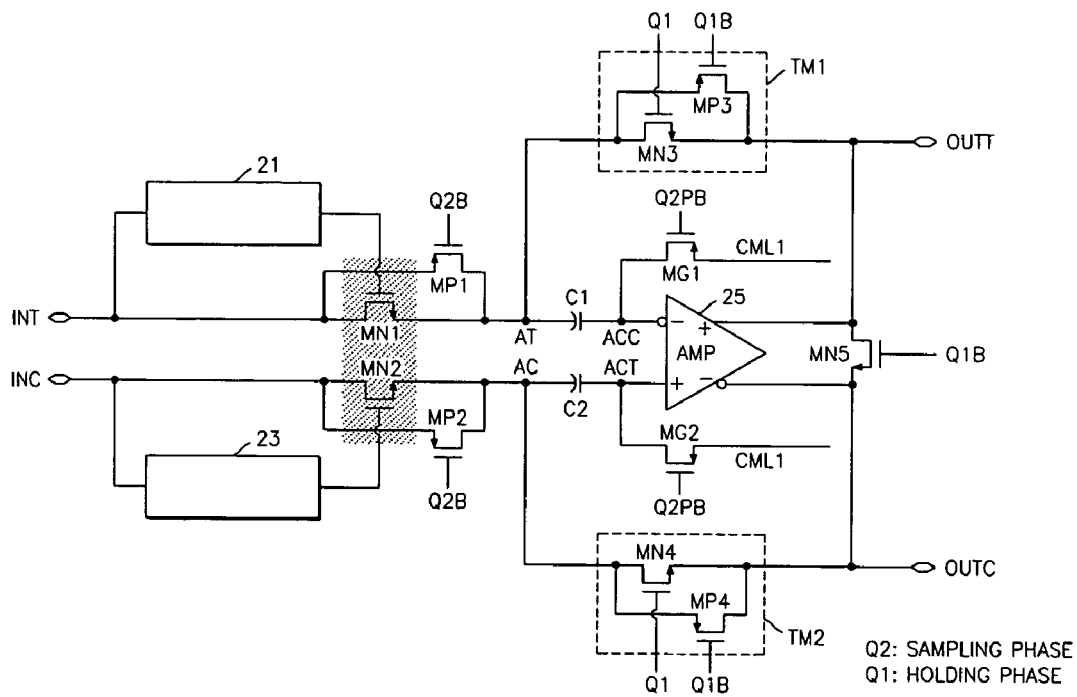
FIG. 4 is a block diagram of a sample-and-hold amplifier according to an embodiment of the present embodiment.

FIG. 4 is a block diagram of a sample-and-hold amplifier according to an embodiment of the present embodiment.

Referring to FIG. 4, the sample-and-hold amplifier 101 includes a first N-channel Metal-Oxide Semiconductor (NMOS) switch transistor MN1, a second NMOS switch transistor MN2, a first P-channel Metal-Oxide Semiconductor (PMOS) MP1, a second PMOS switch transistor MP2, a first clock boosting circuit 21, a second boosting circuit 23, a first capacitor C1, a second capacitor C2, an amplifier 25, a first transmission gate TM 1, a second transmission gate TM2, and an NMOS transistor MN5.

The first NMOS switch transistor MN1 is connected to a positive input terminal INT, and the second NMOS switch transistor MN2 is connected to a negative input terminal INC. The first clock boosting circuit 21 is connected to the positive input terminal INT and the gate of the first NMOS switch transistor MN1 to maintain the ON resistance of the first NMOS switch transistor MN1 at a small and constant value regardless of the voltage variation of a signal input through the positive input terminal INT. The second clock boosting circuit 23 is connected to the negative input terminal INC and the gate of the second NMOS switch transistor MN2 to maintain the ON resistance of the second NMOS switch transistor MN2 at a small and constant value regardless of the voltage variation of a signal input through the negative input terminal INC.

The first PMOS switch transistor MP1 is connected in parallel to the first NMOS switch transistor MN1 between the positive input terminal INT and a first node AT and responds to the inversion signal of the sampling clock. One end of the first capacitor C1 is connected to the first node AT, and one end of the second capacitor C2 is connected to a second node AC. The amplifier 25 differentially amplifies signals transmitted through the first and second capacitors C1 and C2, and outputs the amplified signals to a positive output terminal OUTT and a negative output terminal OUTC.

The first transmission gate TM1 is connected between the first node AT and the positive output terminal OUTT, and responds to a holding clock Q1 and the inversion signal Q1B thereof. The second transmission gate TM2 is connected between the second node AC and the negative output terminal OUTC, and responds to a holding clock Q1 and the inversion signal Q1B thereof. The NMOS transistor MN5 is connected between the positive output terminal OUTT and the negative output terminal OUTC, and responds to the inversion signal Q1B of the holding clock. In particular, a voltage higher than a power source voltage is applied to the first and second NMOS switch transistors MN1 and MN2.

Figure 5:
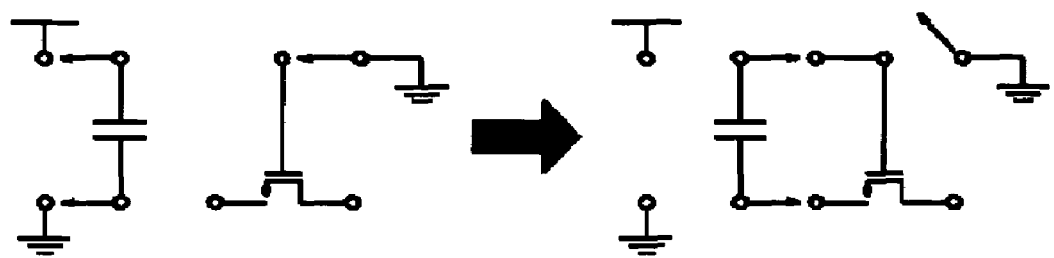
FIG. 5 is a diagram showing the input operation of a sample-and-hold amplifier using clock boosting according to an embodiment of the present invention.

FIG. 5 is a diagram showing the input operation of a sample-and-hold amplifier using clock boosting in accordance with an embodiment of the present invention.

Of the components of a VSB/QAM chip, that is, a chip for receiving digital television, the analog-digital converter has the most sensitive characteristics. At the time of sampling a high-speed input, harmonics increase in proportion to the variation and increase of impedance.

That is, at the time of sampling, a low-pass filter is formed by a resistor and a capacitor. The low-pass filter influences a high-speed intermediate frequency signal and reduces the performance of a VSB/QAM chip that receives digital television.

When a clock is high at the PMOS input switch, a Vgs voltage is always constant regardless of input signal. At this time, transistor ON-resistance (Ron) is inversely proportional to Vgs-Vth. When it is assumed that Vth is constant, Ron is constant if Vgs (voltage stored in cap) is constant.

By keeping the gate of the transistor constant regardless of input signal, the characteristics of a digital television reception terminal are improved, a high-speed analog-digital converter can be accommodated and a mixing function can be performed at the same time.

Figure 6:
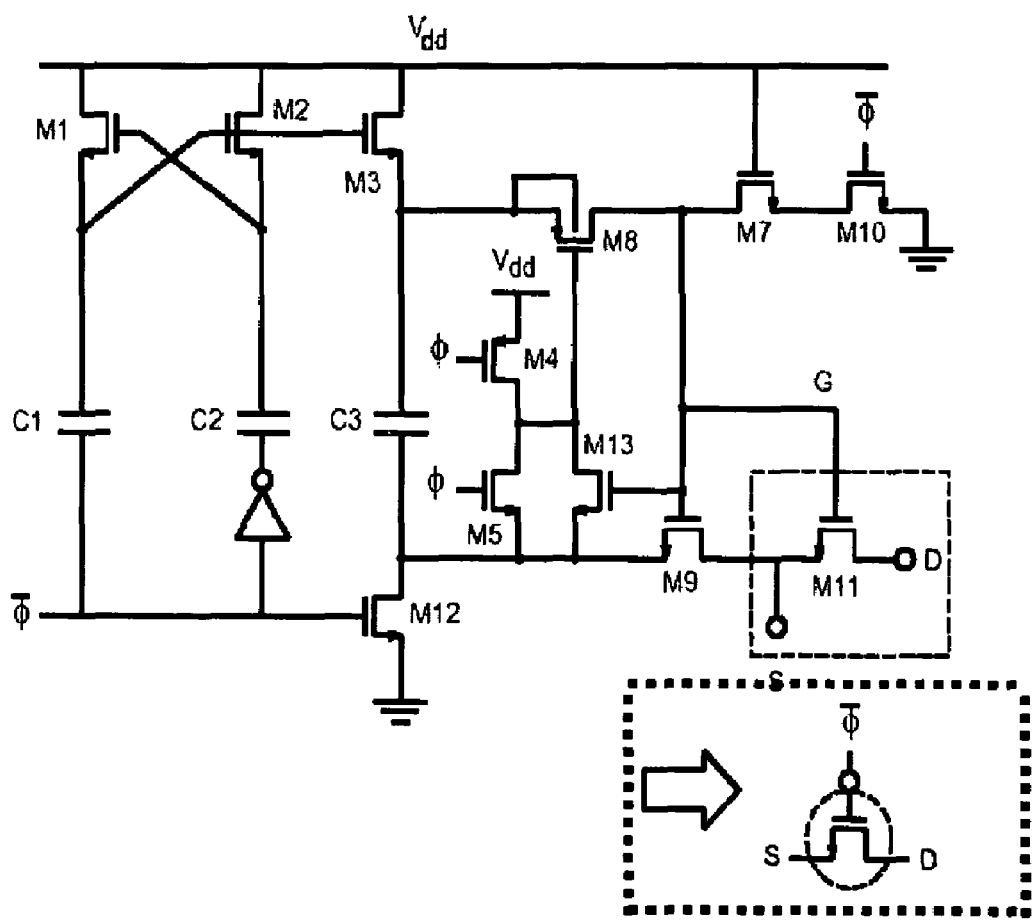
FIG. 6 is a circuit diagram of a boosting circuit according to an embodiment of the present invention.

FIG. 6 is a circuit diagram of a boosting circuit according to an embodiment of the present invention.

Referring to FIG. 6, a clock boosting circuit 21 or 23 shown in FIG. 4 includes first to third capacitors C1, C2 and C3, first to ninth NMOS transistors M1 to M3, M5, M7, M9, M10, M11 and M13 and first to third PMOS transistors M4 and M8.

The inversion signal of a sampling clock φ is applied to one end of the first capacitor C1, and the sample clock is applied to one end of the second capacitor C2. A power source voltage VDD is applied to the drain of the first NMOS transistor M1, the other end of the first capacitor C1 is connected to the source of the first NMOS transistor M1, and the other end of the second capacitor C2 is connected to the gate of the first NMOS transistor M1. The power source voltage VDD is applied to the drain of the second NMOS transistor M2, the other end of the second capacitor C2 is connected to the source of the second NMOS transistor M2, and the source of the first NMOS transistor M1 is connected to the gate of the second NMOS transistor M2. The power source voltage VDD is applied to the drain of the third NMOS transistor M3, and the gate of the second NMOS transistor M3 is connected to the gate of the second NMOS transistor M2. The source of the third NMOS transistor C3 is connected to one end of the third capacitor C3. The other end of the third capacitor C3 is connected to the drain of the fourth NMOS transistor M12, the inversion signal of the sampling clock is applied to the gate of the fourth NMOS transistor M12, and a ground voltage is applied to the source of the fourth NMOS transistor M12.

The power source voltage VDD is applied to the source of the first PMOS transistor M4, and the sampling clock φ is applied to the gate of the first PMOS transistor M4. The drain of the first PMOS transistor M4 is connected to the drain of the fifth NMOS transistor M5, the sampling clock φ is applied to the gate of the fifth NMOS transistor M5, and the other end of the third capacitor C3 is connected to the source of the fifth NMOS transistor M5. The drain of the fifth NMOS transistor M5 is connected to the drain of the sixth NMOS transistor M13, and the other end of the third capacitor C3 is connected to the source of the sixth NMOS transistor M13. The source of the third NMOS transistor M3 is connected to the source of the second PMOS transistor M8, the drain of the sixth NMOS transistor M7 is connected to the gate of the second PMOS transistor M8, and the output terminal OUT of the clock boosting circuit is connected to the drain of the second PMOS transistor M8.

The other end of the third capacitor C3 is connected to the source of the seventh NMOS transistor M9, the output terminal OUT of the clock boosting circuit is connected to the gate of the seventh NMOS transistor M9, and the input terminal IN of the clock boosting circuit is connected to the drain of the seventh NMOS transistor M9. The output terminal OUT of the clock boosting circuit is connected to the drain of the eighth NMOS transistor M10, and the power source voltage VDD is applied to the gate of the eighth NMOS transistor M10. The source of the eighth NMOS transistor M10 is connected to the drain of the ninth NMOS transistor M11, the inversion signal φ of the sampling clock is applied to the gate of the ninth NMOS transistor M11, and the ground voltage is applied to the source of the ninth NMOS transistor M11.

If the clock φ is OFF, the transistors M7 and M10 discharge the gate of the transistor M11. At the same time, VDD is applied to the capacitor C1 through the transistors M3 and M12. At this time, the capacitor C1 functions as a battery. The transistors M8 and M9 are separated from the capacitor C1.

If the clock φ is high, the transistor M5 reduces the gate voltage of the transistor M8, and moves the charge of the capacitor C1 to the gate G. At this time, the transistors M9 and M11 are turned on, and the transistor M9 maintains the gate G at a constant voltage regardless of input voltage.

As described above, the sample-and-hold amplifier of the analog-digital converter performs a mixer function to drop the frequency of an intermediate frequency band signal without using a mixer. Accordingly, a VSB/QAM circuit for receiving digital television does not use a mixer, the unit cost of a board can be considerably reduced.

Furthermore, when the high-speed intermediate band input signal of the analog-digital converter is sampled, the impedance value of the input can be maintained without change. Accordingly, the noise characteristics (SNR, SNDR, SFDR, INL and DNL) of the analog-digital converter generated by the variation of the input signal can be significantly reduced. As a result, the analog-digital converter of the present invention influences the operational characteristics of the entire VSB/QAM chip, so that the improvement in characteristics can be achieved.

Furthermore, when the intermediate band input signal of the analog-digital converter is sampled, the input impedance of the sampling switch can be reduced, so that the AC/DC noise (SNR, SNDR, SFDR, INL and DNL) of the analog-digital converter can be considerably reduced, so that the operational characteristics of the entire VSB/QAM chip can be improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An analog-digital converter, comprising:
   a sample-and-hold amplifier for sampling an analog input signal using clock boosting;
   a first analog-digital converter for receiving a signal sampled by the sample-and-hold amplifier, and converting the sampled signal into a plurality of bits of first digital output code;
   a multiple digital-analog converter for receiving and storing the signal sampled by the sample-and-hold amplifier, and amplifying and outputting difference between the stored signal and an analog signal corresponding to the first digital output code;
   a second analog-digital converter for receiving the output signal of the multiple digital-analog converter, and converting the output signal into a plurality of bits of second digital output code; and
   a digital correction logic for receiving the first digital output code and the second digital output code, overlapping certain bits of the first digital output code with certain bits of the second digital output code, and outputting remaining bits, exclusive of overlapping bits, as final digital output code,
   wherein the sample-and-hold amplifier comprises a clock boosting circuit that is connected to an input terminal, to which the analog input signal is input, and a gate of a switch transistor, which is connected to the input terminal, so as to maintain an ON resistance of the switch transistor at a small and constant value and fixed input impedance.

2. The analog-digital converter as set forth in claim 1, wherein the multiple digital-analog converter uses a combined capacitor switching technique.

3. The analog-digital converter as set forth in claim 1, wherein the first analog-digital converter and the second analog-digital converter are flash analog-digital converters.

4. The analog-digital converter as set forth in claim 1, wherein the switch transistor of the sample-and-hold amplifier further comprises a first N-channel Metal-Oxide Semiconductor (NMOS) switch transistor connected to a positive input terminal, and a second NMOS switch transistor connected to a negative input terminal, and
   wherein the clock boosting circuit comprises a first clock boosting circuit connected to the positive input terminal and a gate of the first NMOS switch transistor so as to maintain an ON resistance of the first NMOS switch transistor at a small and constant value regardless of a voltage variation of a signal input through the positive input terminal, and a second clock boosting circuit connected to the negative input terminal and a gate of the second NMOS switch transistor so as to maintain an ON resistance of the second NMOS switch transistor at a small and constant value regardless of a voltage variation of a signal input through the negative input terminal.

5. The analog-digital converter as set forth in claim 4, wherein the sample-and-hold amplifier further comprises:
   a first P-channel Metal-Oxide Semiconductor (PMOS) switch transistor connected in parallel with the first NMOS switch transistor between the positive input terminal and a first node and configured to respond to a sampling clock;
   a second PMOS switch transistor connected in parallel with the second NMOS switch transistor between the negative input terminal and a second node and configured to respond to the sampling clock;

a first capacitor a first end of which is connected to the first node;

a second capacitor a first end of which is connected to the second node;

an amplifier configured to differentially amplify a signal transmitted through the first capacitor and a signal transmitted through the second capacitor and output the differentially amplified signals to the positive output terminal and the negative output terminal;

a first transmission gate connected between the first node and the positive output terminal and configured to respond to a holding clock;

a second transmission gate connected between the second node and the negative output terminal and configured to respond to the holding clock; and an NMOS transistor connected between the positive output terminal and the negative output terminal and configured to respond to the holding clock.

6. The analog-digital converter as set forth in claim 4, wherein the first and second gate clock boosting circuits each comprise:

a first capacitor a first end of which is connected to an inversion signal of the sampling clock;

a second capacitor a first end of which is connected to the sampling clock through a reverse inverter;

a first NMOS transistor to a drain of which a power source voltage is applied, to a source of which a second end of the first capacitor is connected, and to a gate of which a second end of the second capacitor is connected;

a second NMOS transistor to a drain of which the power source voltage is applied, to a source of which a second end of the second capacitor is connected, and to a gate of which a source of the second NMOS transistor is connected;

a third NMOS transistor to a drain of which the power source voltage is applied and to a gate of which a gate of the second NMOS transistor is connected;

a third capacitor to a first end of which a source of the third NMOS transistor is connected;

a fourth NMOS transistor to a drain of which a second end of the third capacitor is connected, to a gate of which an inversion signal of the sampling clock is applied, to a source of which a ground voltage is applied;

a first PMOS transistor to a source of which the power source voltage is applied, and to a gate of which the sampling clock is applied;

a fifth NMOS transistor to a drain of which a drain of the first PMOS transistor is connected, to a gate of which the sampling clock is connected, and to a source of which a second end of the third capacitor is connected;

a sixth NMOS transistor to a drain of which a drain of the first PMOS transistor is connected, and to a source of which a second end of the third capacitor is connected;

a second PMOS transistor to a source of which a source of the third NMOS transistor is connected, to a gate of which a drain of the sixth NMOS transistor is connected, to a drain of which an output terminal of the clock boosting circuit is connected, and the gate and the source of which are connected to each other;

a seventh NMOS transistor to a source of which a second end of the third capacitor is connected, to a gate of which an output terminal of the clock boosting circuit is connected, and to a drain of which an input terminal of the clock boosting circuit is connected;

an eighth NMOS transistor to a drain of which an output terminal of the clock boosting circuit is connected, and to a gate of which the power source voltage is applied; and a ninth NMOS transistor to a drain of which a source of the eighth NMOS transistor is connected, to a gate of which the inversion signal of the sampling clock is applied, and to a source of which the ground voltage is applied.

7. An analog-digital converter, comprising:

a sample-and-hold amplifier for sampling an analog input signal using clock boosting;

a first analog-digital converter for receiving a signal sampled by the sample-and-hold amplifier, and converting the sampled signal into a plurality of bits of a first digital output code;

a multiple digital-analog converter for receiving and storing the signal sampled by the sample-and-hold amplifier, and amplifying and outputting a difference between the stored signal and an analog signal corresponding to the first digital output code;

a second analog-digital converter for receiving the output signal of the multiple digital-analog converter, and converting the output signal into a plurality of bits of a second digital output code; and a digital correction logic for receiving the first digital output code and the second digital output code, overlapping certain bits of the first digital output code with certain bits of the second digital output code, and outputting remaining bits, exclusive of overlapping bits, as a final digital output code, wherein the sample-and-hold amplifier comprises:

a first N-channel Metal-Oxide Semiconductor (NMOS) switch transistor connected to a positive input terminal;

a second NMOS switch transistor connected to a negative input terminal;

a first clock boosting circuit connected to the positive input terminal and a gate of the first NMOS switch transistor so as to maintain an ON resistance of the first NMOS switch transistor at a small and constant value regardless of a voltage variation of a signal input through the positive input terminal; and a second clock boosting circuit connected to the negative input terminal and a gate of the second NMOS switch transistor so as to maintain an ON resistance of the second NMOS switch transistor at a small and constant value regardless of a voltage variation of a signal input through the negative input terminal.

8. The analog-digital converter as set forth in any one of claims 1 and 7–3, wherein the first analog-digital converter, the second analog-digital converter and the multiple digital-analog converter are one or more first analog-digital converters, one or more second analog-digital converters and one or more multiple digital-analog converters, respectively.

9. The analog-digital converter as set forth in claim 7, wherein the sample-and-hold amplifier further comprises:

a first P-channel Metal-Oxide Semiconductor (PMOS) switch transistor connected in parallel with the first NMOS switch transistor between the positive input terminal and a first node and configured to respond to a sampling clock;

a second PMOS switch transistor connected in parallel with the second NMOS switch transistor between the negative input terminal and a second node and configured to respond to the sampling clock;

a first capacitor a first end of which is connected to the first node;

a second capacitor a first end of which is connected to the second node;

an amplifier configured to differentially amplify a signal transmitted through the first capacitor and a signal transmitted through the second capacitor and output the differentially amplified signals to the positive output terminal and the negative output terminal;

a first transmission gate connected between the first node and the positive output terminal and configured to respond to a holding clock;

a second transmission gate connected between the second node and the negative output terminal and configured to respond to the holding clock; and an NMOS transistor connected between the positive output terminal and the negative output terminal and configured to respond to the holding clock.

10. The analog-digital converter as set forth in claim 7, wherein the first and second gate clock boosting circuits each comprise:

a first capacitor a first end of which is connected to an inversion signal of the sampling clock;

a second capacitor a first end of which is connected to the sampling clock through a reverse inverter;

a first NMOS transistor to a drain of which a power source voltage is applied, to a source of which a second end of the first capacitor is connected, and to a gate of which a second end of the second capacitor is connected;

a second NMOS transistor to a drain of which the power source voltage is applied, to a source of which a second end of the second capacitor is connected, and to a gate of which a source of the second NMOS transistor is connected;

a third NMOS transistor to a drain of which the power source voltage is applied and to a gate of which a gate of the second NMOS transistor is connected;

a third capacitor to a first end of which a source of the third NMOS transistor is connected;

a fourth NMOS transistor to a drain of which a second end of the third capacitor is connected, to a gate of which an inversion signal of the sampling clock is applied, to a source of which a ground voltage is applied;

a first PMOS transistor to a source of which the power source voltage is applied, and to a gate of which the sampling clock is applied;

a fifth NMOS transistor to a drain of which a drain of the first PMOS transistor is connected, to a gate of which the sampling clock is connected, and to a source of which a second end of the third capacitor is connected;

a sixth NMOS transistor to a drain of which a drain of the first PMOS transistor is connected, and to a source of which a second end of the third capacitor is connected;

a second PMOS transistor to a source of which a source of the third NMOS transistor is connected, to a gate of which a drain of the sixth NMOS transistor is connected, to a drain of which an output terminal of the clock boosting circuit is connected, and the gate and the source of which are connected to each other;

a seventh NMOS transistor to a source of which a second end of the third capacitor is connected, to a gate of which an output terminal of the clock boosting circuit is connected, and to a drain of which an input terminal of the clock boosting circuit is connected;

an eighth NMOS transistor to a drain of which an output terminal of the clock boosting circuit is connected, and to a gate of which the power source voltage is applied; and a ninth NMOS transistor to a drain of which a source of the eighth NMOS transistor is connected, to a gate of which the inversion signal of the sampling clock is applied, and to a source of which the ground voltage is applied.

11. The analog-digital converter as set forth in claim 7, wherein the first analog-digital converter and the second analog-digital converter are flash analog-digital converters.

12. The analog-digital converter as set forth in claim 7, wherein the multiple digital-analog converter uses a combined capacitor switching technique.

* * * * *